(12) United States Patent
Chen et al.

(10) Patent No.: US 9,318,414 B2
(45) Date of Patent: Apr. 19, 2016

(54) INTEGRATED CIRCUIT STRUCTURE WITH THROUGH-SEMICONDUCTOR VIA

(71) Applicant: GLOBALFOUNDRIES INC., Grand Cayman (KY)

(72) Inventors: Fen Chen, Williston, VT (US); Minhua Lu, Mohegan Lake, NY (US); Timothy D. Sullivan, Underhill, VT (US); Ping-Chuan Wang, Hopewell Junction, NY (US); Lijuan Zhang, Beacon, NY (US)

(73) Assignee: GLOBALFOUNDRIES Inc., Grand Cayman (KY)

( * ) Notice: Subject to any disclaimer, the term of this patent is extended or adjusted under 35 U.S.C. 154(b) by 144 days.

(21) Appl. No.: 14/065,454

(22) Filed: Oct. 29, 2013

(65) Prior Publication Data
US 2015/0115460 A1 Apr. 30, 2015

(51) Int. Cl.
*H01L 23/48* (2006.01)
*H01L 23/522* (2006.01)

(52) U.S. Cl.
CPC .......... *H01L 23/481* (2013.01); *H01L 23/5226* (2013.01); *H01L 2224/11* (2013.01); *H01L 2924/0002* (2013.01)

(58) Field of Classification Search
CPC .......................... H01L 21/481; H01L 23/6898
USPC .......... 257/621, 751, 774; 438/627, 637, 643, 438/672, 687
See application file for complete search history.

(56) References Cited

U.S. PATENT DOCUMENTS

| | | | |
|---|---|---|---|
| 7,064,064 B2 | 6/2006 | Chen et al. |
| 7,190,079 B2 | 3/2007 | Andricacos et al. |
| 7,651,906 B2 | 1/2010 | Park et al. |
| 7,816,945 B2 | 10/2010 | Feng et al. |
| 8,211,756 B2 | 7/2012 | Feng et al. |
| 8,288,270 B2 | 10/2012 | Farooq et al. |
| 8,299,612 B2 | 10/2012 | West et al. |
| 8,304,863 B2 | 11/2012 | Filippi et al. |
| 2003/0098510 A1 | 5/2003 | Trivedi et al. |
| 2003/0122259 A1 | 7/2003 | Bobba et al. |
| 2003/0148603 A1 | 8/2003 | Gardner |

(Continued)

FOREIGN PATENT DOCUMENTS

EP 0289274 A2 2/1988

OTHER PUBLICATIONS

Shayan et al., "3D Stacked Power Distribution Considering Substrate Coupling", IEEE, 2009, pp. 225-230.

(Continued)

*Primary Examiner* — Matthew W Such
*Assistant Examiner* — Warren H Kilpatrick
(74) *Attorney, Agent, or Firm* — Michael LeStrange; Hoffman Warnick LLC (57) ABSTRACT

The present disclosure generally provides for integrated circuit (IC) structures with through-semiconductor vias (TSV). In an embodiment, an IC structure may include a through-semiconductor via (TSV) embedded in a substrate, the TSV having a cap; a dielectric layer adjacent to the substrate; a metal layer adjacent to the dielectric layer; a plurality of vias each embedded within the dielectric layer and coupling the metal layer to the cap of the TSV at respective contact points, wherein the plurality of vias is configured to create a substantially uniform current density throughout the TSV.

20 Claims, 8 Drawing Sheets

(56) References Cited

U.S. PATENT DOCUMENTS

| | | |
|---|---|---|
| 2007/0063313 A1 | 3/2007 | Barth et al. |
| 2008/0073747 A1 | 3/2008 | Chao et al. |
| 2010/0182041 A1 | 7/2010 | Feng et al. |
| 2011/0254165 A1* | 10/2011 | Muranaka ......... H01L 21/76832 257/751 |
| 2012/0031768 A1 | 2/2012 | Reid et al. |
| 2012/0119374 A1 | 5/2012 | Rahman et al. |
| 2012/0153458 A1 | 6/2012 | Howard et al. |
| 2012/0199983 A1 | 8/2012 | Farooq et al. |
| 2012/0258408 A1 | 10/2012 | Mayer et al. |
| 2012/0280395 A1 | 11/2012 | Farooq et al. |
| 2012/0292779 A1 | 11/2012 | Interrante et al. |
| 2012/0313247 A1 | 12/2012 | Yu et al. |
| 2012/0322261 A1 | 12/2012 | Shue et al. |
| 2013/0015504 A1* | 1/2013 | Kuo ....................... H01L 21/84 257/213 |
| 2014/0264869 A1* | 9/2014 | Huang .............. H01L 23/53238 257/751 |
| 2014/0346680 A1* | 11/2014 | Gers ................ H01L 21/76898 257/774 |
| 2015/0021784 A1* | 1/2015 | Lin ....................... H01L 23/481 257/774 |
| 2015/0061147 A1* | 3/2015 | Lin ................... H01L 23/53238 257/774 |

OTHER PUBLICATIONS

Swaminathan, "Electrical Design and Modeling Challenges for 3D System Integration", DesignCon2012, 31 pages.

Kilpatrick, Office Action Communication for U.S. Appl. No. 14/065,451 dated May 27, 2015, 14 pages.

Kilpatrick, Office Action for U.S. Appl. No. 14/065,451 dated Oct. 22, 2015, 27 pages.

* cited by examiner

INTEGRATED CIRCUIT STRUCTURE WITH THROUGH-SEMICONDUCTOR VIA

BACKGROUND

Embodiments of the invention relate generally to structures of integrated circuits (ICs). More specifically, the disclosure relates to through-semiconductor via (TSV) structures with a metal cap, and methods of fabricating those structures.

TSVs are electrically conductive structures extending through a semiconductor layer or wafer for coupling two or more components on either side of the semiconductor material. In conventional structures, the TSV is substantially perpendicular to a metal layer. This structure may cause electric current to follow a substantially "L" shaped path from the metal layer into the TSV. Typically, current density in this structure is highest at the elbow of the current path.

High current density and local joule heating in one portion of the TSV may cause the TSV to experience electromigration degradation. "Electromigration" refers to physical motion of atoms out of areas where current density is very high. Electromigration is caused primarily by frictional force between metal ions and flowing electrons. Electromigration may damage a metal line or via.

Risk of electromigration can be greatest at a surface of a TSV, where metal contacts a dielectric interface. Over time, electromigration can cause thermal and tensile stresses in portions of semiconductor wiring structures. Thermal and tensile stresses may create "voids." In general, a "void" is a portion of wiring composed substantially of empty space, and therefore having a high electrical resistance. If voiding occurs, the risk of electromigration damage in the TSV can further increase.

SUMMARY

According to one embodiment of the present invention, an integrated circuit (IC) structure may comprise a through-semiconductor via (TSV) embedded in a substrate, the TSV; a dielectric layer adjacent to the substrate; a metal layer adjacent to the dielectric layer; a plurality of vias each embedded within the dielectric layer and coupling the metal layer to the TSV at respective contact points, wherein the plurality of vias is configured to create a substantially uniform current density throughout the TSV.

According to another embodiment of the present invention, an integrated circuit (IC) structure may comprise a through-semiconductor via (TSV) embedded in a substrate; a dielectric layer adjacent to the substrate; a first via embedded in the dielectric layer and coupling the TSV to a first metal layer; and a second via embedded in the dielectric layer and coupling the TSV to a second metal layer, the second metal layer being distinct from the first metal layer, wherein the first via and the second via are configured to create a substantially uniform current density throughout the TSV.

According to an additional embodiment of the present invention, an integrated circuit (IC) structure may comprise a through-semiconductor via (TSV) having a center axis and an end; a dielectric layer adjacent to the TSV; a metal wire adjacent to the dielectric layer; and a via embedded in the dielectric layer and electrically coupling the metal wire to the TSV, wherein a centroid of the via is substantially aligned with the center axis of the TSV.

BRIEF DESCRIPTION OF THE SEVERAL VIEWS OF THE DRAWINGS

It is noted that the drawings of the invention are not to scale. The drawings are intended to depict only typical aspects of the invention, and therefore should not be considered as limiting the scope of the invention. In the drawings, like numbering represents like elements between the drawings.

DETAILED DESCRIPTION

In the following description, reference is made to the accompanying drawings that form a part thereof, and in which is shown by way of illustration specific exemplary embodiments in which the present teachings may be practiced. These embodiments are described in sufficient detail to enable those skilled in the art to practice the present teachings, and it is to be understood that other embodiments may be used and that changes may be made without departing from the scope of the present teachings. The following description is, therefore, merely illustrative.

Features of the present disclosure include integrated circuit (IC) structures. An IC structure according to the present disclosure may include a substrate. A through-semiconductor via (TSV) can be embedded in the substrate. A dielectric layer may be adjacent to the substrate. A metal layer may be adjacent to the dielectric layer. A plurality of vias can also be embedded within the dielectric layer, coupling the metal layer to the TSV. The plurality of vias can be configured, according to any arrangement described herein, to create a substantially uniform current density throughout the TSV. Other structural variations and independent embodiments are also described.

Figure 1:
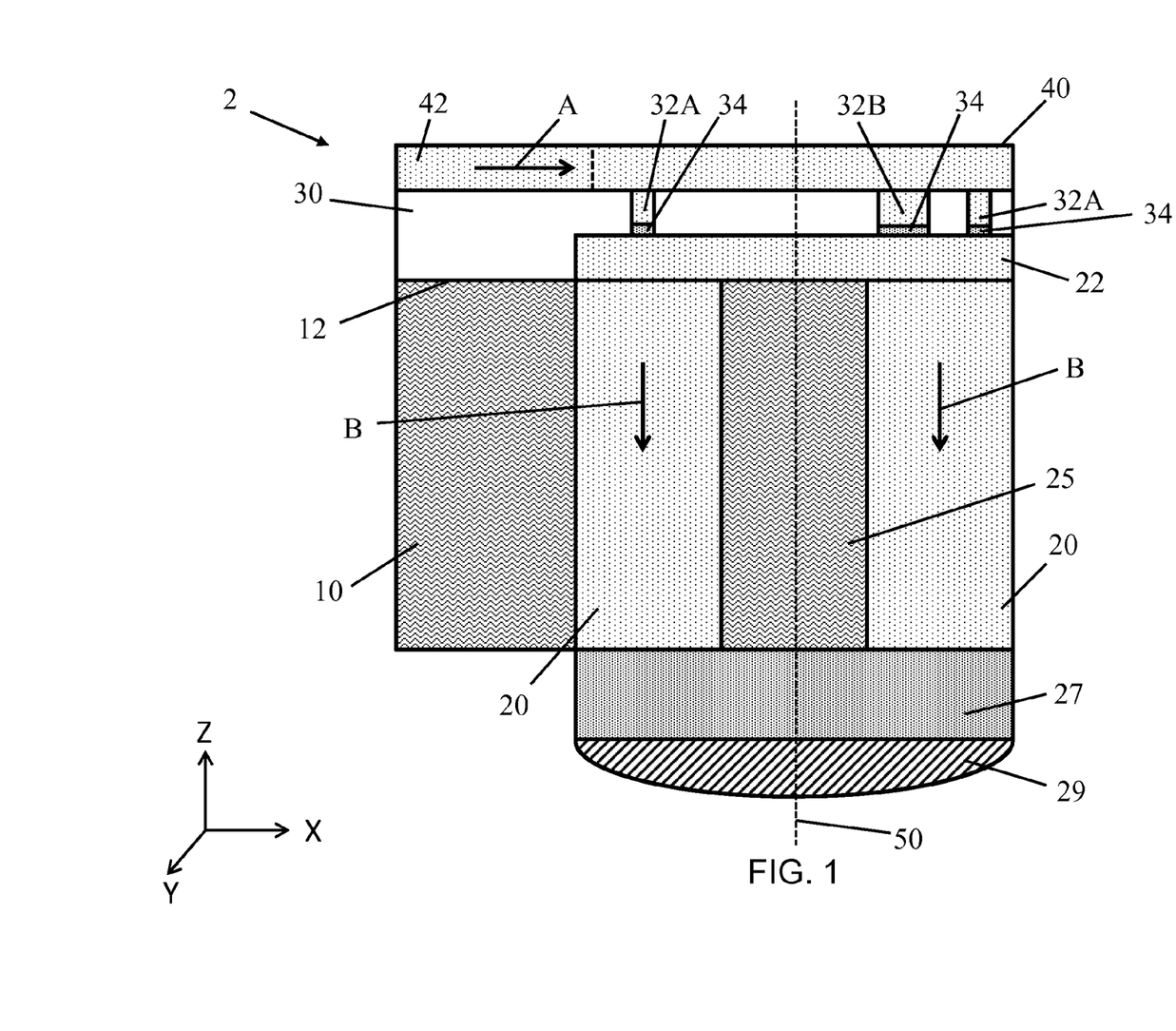
FIG. 1 shows a cross sectional view in plane X-Z of an IC structure according to an embodiment of the present disclosure.
Figure 2:
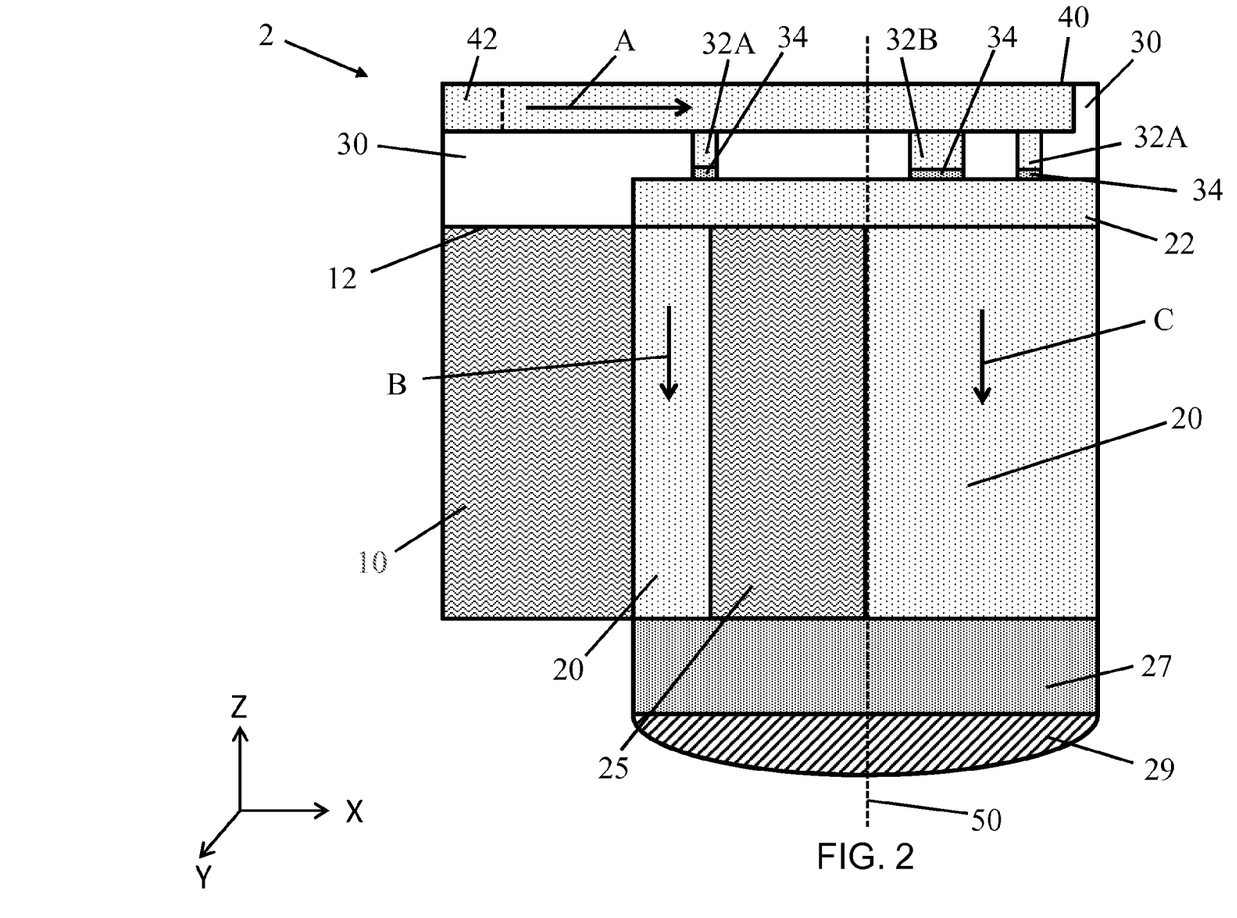
FIG. 2 shows a cross sectional view in plane X-Z of another IC structure according to an embodiment of the present disclosure.

Referring to FIG. 1 and FIG. 2, together, each drawing depicts an integrated circuit (IC) structure 2 according to an embodiment of the present disclosure. FIG. 2 differs from FIG. 1 in that a silicon pillar 25, discussed in further detail below, can be located at the center of a through-semiconductor via 20 (FIG. 1) or located off-center (FIG. 2). IC structure 2 can include a substrate 10. Substrate 10 of IC structure 2 can be a wafer in a larger semiconductor structure, and may include a first surface 12. Materials used in the composition of substrate 10 may include but are not limited to silicon, germanium, silicon germanium, silicon carbide, and those consisting essentially of one or more III-V compound semiconductors having a composition defined by the formula $Al_{X1}Ga_{X2}In_{X3}As_{Y1}P_{Y2}N_{Y3}Sb_{Y4}$, where X1, X2, X3, Y1, Y2, Y3, and Y4 represent relative proportions, each greater than or equal to zero and X1+X2+X3+Y1+Y2+Y3+Y4=1 (1 being the total relative mole quantity). Other suitable substrates include II-VI compound semiconductors having a composition $Zn_{A1}Cd_{A2}Se_{B1}Te_{B2}$, where A1, A2, B1, and B2 are relative proportions each greater than or equal to zero and A1+A2+B1+B2=1 (1 being a total mole quantity). Furthermore, a portion or entire semiconductor substrate may be strained.

A through-semiconductor via (TSV) 20 may be embedded within substrate 10. As known in the art, a TSV may refer to an electrically conductive via etched through a substrate or semiconductor "wafer" to provide a wafer-to-wafer electrical interconnect scheme compatible with 3D wafer-level packaging. Each TSV can be used to electrically couple metal wires of a semiconductor to other components powered by an electric current. TSV 20 may be composed of metals such as copper, aluminum, tungsten, silver, and other metals with similar conductive properties. TSV 20 may optionally include a cap 22 fabricated according to a routine fabrication process, such as a back-end-of-line (BEOL) process. Cap 22 may be embedded in other components and materials of IC structure 2, such as layers of metal and dielectric materials described elsewhere herein. As such, cap 22 can be made from a material similar to or distinct from TSV 20, such as a metal (e.g., aluminum, copper, tungsten, silver, or alloys and derivatives thereof).

As also shown in FIG. 1, IC structure 2 can include a silicon pillar 25 embedded within TSV 20. Silicon pillar 25 may be electrically insulative, thereby increasing the distribution of electric current within TSV 20 because electric current can pass through electrically conductive areas of TSV 20 outside silicon pillar 25. A contact 27 may contact TSV 20 at a surface opposite to first surface 12. Contact 27 can be used to electrically couple TSV 20 to an IC component 29, or provide another desired electrical connection.

TSV 20 can be electrically insulated from substrate 10 by a dielectric layer 30 or similar layer of electrically insulative material. As known in the art, a "dielectric" refers to an electrically insulative material that substantially blocks the flow of electric current. As such, dielectric layer 30 essentially defines an insulative barrier between components of a semiconductor structure (e.g., between TSV 20 and other conductive or semiconductive structures). Common dielectrics may include but are not limited to: silicon nitride ($Si_3N_4$), silicon oxide ($SiO_2$), fluorinated $SiO_2$ (FSG), hydrogenated silicon oxycarbide (SiCOH), porous SiCOH, borophospho-silicate glass (BPSG), silsesquioxanes, carbon (C) doped oxides (i.e., organosilicates) that include atoms of silicon (Si), carbon (C), oxygen (O), and/or hydrogen (H), thermosetting polyarylene ethers, SiLK (a polyarylene ether available from Dow Chemical Corporation), a spin-on silicon-carbon containing polymer material available from JSR Corporation, other low dielectric constant (<3.9) material, or layers thereof.

Several vias 32A, 32B may be embedded within dielectric layer 30. A "via" generally may refer to a hole etched in dielectric layer 30 which has been filled with a conductive metal (e.g., copper, aluminum, tungsten, silver, etc.) to provide a vertical electrical connection between components, including interconnect metal lines arranged in stacks. Each via 32A, 32B may be coupled to cap 22 of TSV 20 at respective contact points. Although described herein as "points," each contact point may be in the form of an area or region. Specifically, each "contact point" may have a corresponding length, width, and/or depth. It is understood that each TSV 20, via 32A, 32B, and/or other metal wires of IC structure 2 may include a liner (not shown), e.g., of refractory metals and/or materials made from refractory metals, such as titanium nitride (TiN), tantalum nitride (TaN), tantalum (Ta), and titanium (Ti). Liners have been omitted from the accompanying figures for the sake of clarity.

A metal layer 40 may be adjacent to and/or contact each via 32A, 32B. As used herein, the term "metal layer" may include a layer of an IC structure that includes a metal wire embedded in a dielectric, such as the substance used in dielectric layer 30. Metal wires in a metal layer, such as metal layer 40, may include metals such as copper, aluminum, tungsten, and silver. Metal layer 40 in some contexts may also be known as a "feeding line," "metal wire," or other term referring to a structure for delivering electric current. In some embodiments, metal layer 40 may be formed in a back end of line (BEOL) process. "Back end of line" (BEOL) processes can refer to operations performed on a semiconductor wafer in the course of device manufacturing, after a first metallization. Accordingly, metal layer 40 can include a BEOL metal layer embedded in an IC structure on one side of a semiconductor wafer or layer, such as substrate 10. Electrical connections from vias 32A, 32B may electrically bridge a feed region 42 of metal layer 40 to TSV 20. In some embodiments, each via 32A, 32B may be electrically coupled to one metal layer 40. Other embodiments, in which vias 32A, 32B are electrically coupled to several metal layers, are also described herein.

To reduce current crowding, vias 32A, 32B may be arranged or configured to create a substantially uniform current density throughout TSV 20, thereby reducing the risk of electromigration. Various example arrangements for creating a substantially uniform current density within TSV 20 are discussed herein. For example, the electrical connection between feed region 42 of metal layer 40 and TSV 20 across each via 32A, 32B may have a selected value of electrical resistance of "electrical resistance configuration." Each via 32A, 32B can have a different corresponding size, shape, material, etc. to create the selected value of electrical resistance. Through varying the resistance of each via 32A, 32B by reference to a corresponding resistance across metal layer 40 from feed region 42, IC structure 2 can be configured to create a substantially uniform current density within TSV 20.

In an embodiment, respective electrical resistances between feed region 42 of metal layer 40 and TSV 20 across each via 32A, 32B may be substantially equal to each other. As a result, electric current will forced to split evenly between each via 32A, 32B in the plurality. In one embodiment, similar values of resistance are provided by having two or more vias 32A, 32B sized differently from each other (e.g., by having different widths), as illustrated by vias 32A, 32B of FIG. 1 and FIG. 2. Thus, by causing electric current from feed region 42 of metal layer 40 split between vias of different sizes, current is guided to desired locations of the TSV, thereby reducing current crowding in TSV 20. In other embodiments, vias 32A, 32B can be similarly sized, but may create similar electrical resistances from feed region 42 of metal layer 40 by including different materials in each respective via 32A, 32B. For example, one via 32A may be composed of tungsten while another via 32B may be composed of copper. Copper has less electrical resistance than tungsten, resulting in each vias 32A, 32B of different materials accounting for different values of electrical resistance over metal layer 40 between feed region 42 and each via 32A, 32B.

If desired, capture pads 34 can be coupled between cap 22 and each via 32A, 32B. Capture pads 34 can be structures, having any desired thickness, made from electrically conductive materials of varying resistance. In general, capture pads 34 can include transition metals, refractory metals, and/or alloys derived from these substances. A "refractory metal" may include ruthenium; however, other refractory metals such as tantalum (Ta), titanium (Ti), tungsten (W), iridium (Ir), rhodium (Rh) and platinum (Pt), etc., or mixtures thereof, may also be employed. A "transition metal" may include metals with valence electrons in two atomic energy levels instead of only one, such as metals from groups three through twelve of the periodic table. Specifically, each capture pad 34 can include transition metals such as copper, cobalt, nickel, tungsten, titanium, palladium, molybdenum, Manganese, gold, iron, and/or alloys thereof. An alloy may include, for example, TiN, TaN, CoW, in addition to alloys of one or more metals. Capture pads 34 can, for example, reduce current density by spreading current from each via 32A, 32B out amongst a larger radial area of cap 22 by providing electrical resistance as well as improved contact between cap 22 and via 32A, 32B. Alternatively, each capture pad 34 can provide a region of increased resistance corresponding to only a portion of via 32A, 32B. Each capture pad 34 may be embedded in cap 22 and/or via 32A, 32B, thereby requiring electrons to cross capture pad 34 before entering cap 22. As such, capture pads 34 can be used to reduce the current density within cap 22 of TSV 20. If desired, some vias 32A, 32B leading to areas prone to current crowding may be coupled to a capture pad 34, while other vias 32A, 32B may lack a capture pad. Although capture pads 34 are discussed and shown with respect to IC structure 2, capture pads 34 can be used in conjunction with other IC structures described elsewhere herein.

The embodiment shown in FIG. 1 is one approach for reducing current crowding in TSV 20, which can be used alone or combined with other IC structures described herein. As electrical current flows along the direction of arrow A, the current density entering TSV 20 from vias 32A, 32B may be substantially uniform. In addition or alternatively, a higher concentration of vias 32A, 32B may be provided at a portion of metal layer 40 where more current is needed, as shown in FIG. 1. The differing electrical resistance between each via 32A, 32B or group thereof can cause current density along lines B in FIG. 1 to be substantially equal to each other. Current crowding and electromigration in TSV 20 may be reduced as a result.

Referring again to both FIG. 1 and FIG. 2, TSV 20 is shown to have a center axis 50. Silicon pillar 25, as shown in FIG. 2, can be off-center and thereby substantially parallel to center axis 50 of TSV 20. As a result, electrical current traveling along line B may need to overcome more electrical resistance than electrical current traveling along line C (FIG. 2) before entering TSV 20. In this manner, current traveling through TSV 20 can be evenly distributed by diverting some current away from areas at which current density is normally highest, resulting in the current density along line B being approximately equal to the current density along line C. In the embodiment of FIG. 1, silicon pillar 25 can be located along center axis 50.

Figure 3:
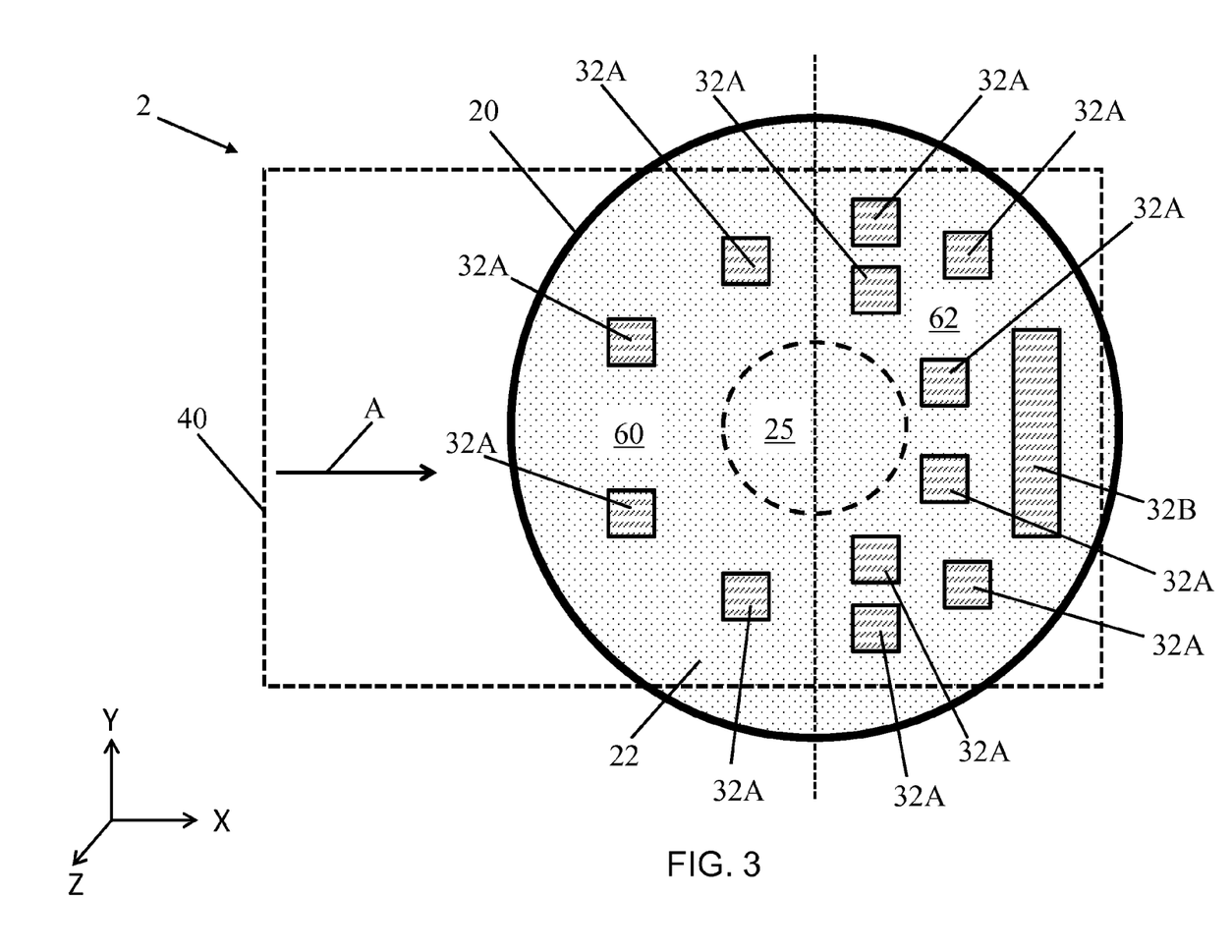
FIG. 3 shows a cross sectional view in plane X-Y of an IC structure according to an embodiment of the present disclosure.

Referring to FIG. 3, a cross sectional view in plane X-Y of IC structure 2 is shown. To evenly distribute electrical current, cap 22 of TSV 20 may be divided into first and second portions 60, 62. In the example shown, portions 60, 62 are defined as semicircular portions (see dashed dividing line). Other portion definitions may also be employed. Cap 22 can contact several vias 32A, 32B, each coupling TSV 20 or cap 22 with metal layer 40 (shown in phantom). Silicon pillar 25 (also shown in phantom) can be embedded within TSV 20.

As shown in FIG. 3, more vias 32A, 32B can be coupled to TSV 20 or cap 22 at second portion 62 than at first portion 60. Further, larger vias (e.g., via 32B) can be coupled to second portion 62 if desired. In some embodiments, larger vias 32B can be in the form of a "via bar." A via bar generally refers to a via with a substantially rectangular cross-sectional area within a single layer, and therefore being longer on one side than on another side. By coupling more vias 32A, 32B at second portion 62 as compared to first portion 60, the electrical resistance of TSV 20 through second portion 62 can be similar to the electrical resistance of TSV 20 through first portion 60. This property of IC structure 2 may be significant because, in the embodiment of FIG. 3, more current traveling along arrow A would otherwise enter first portion 60 than would enter second portion 62. As a result, the different sizes and distribution of vias within first portion 60 and second portion 62 can equalize the current densities through first portion 60 and second portion 62 to thereby reduce electromigration in TSV 20.

In various embodiments, first portion 60 and second portion 62 can be defined as desired, with second portion 62 having more vias 32A, 32B than first portion 60. In other embodiments, first portion 60 and second portion 62 may include the same number of vias 32A, 32B, but with second portion 62 having 32A, 32B of larger size for reduced electrical resistance. If desired, first portion 60 may also have more vias 32A, 32B than second portion 62. In the embodiment of FIG. 3, first portion 60 and second portion 62 are each semicircular portions of cap 22, with each portion 60, 62 corresponding to an approximate half cross-section of cap 22. In addition, each portion 60, 62 may have the same number of vias 32A, 32B, but with one or more of vias 32A, 32B having greater electrical resistance than others because some vias 32A, 32B may be made from different materials, as described elsewhere herein.

Figure 4:
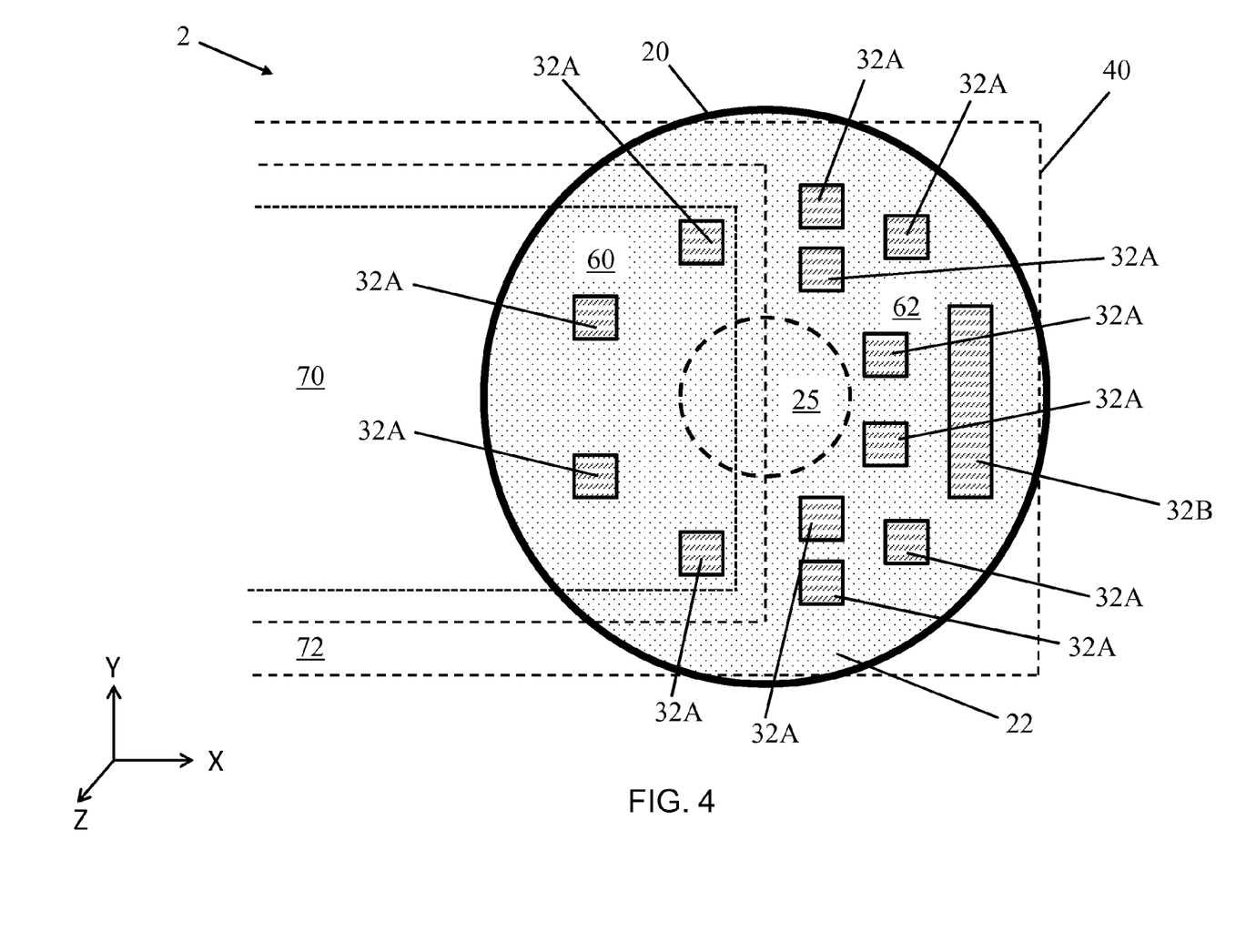
FIG. 4 shows a cross sectional view in plane X-Y of an alternative IC structure according to an embodiment of the present disclosure.

Turning to FIG. 4, an alternative embodiment of a cross sectional view in plane X-Y of IC structure 2 is shown. In the embodiment of FIG. 4, TSV 20 or cap 22 is coupled to metal layer 40, which includes a first section 70 and a second section 72, denoted by corresponding phantom lines. First section 70 and second section 72 may correspond, for example, to wires with different line width within the same metal layer 40. The arrangement of FIG. 4 can further distribute current flow in TSV 20 by coupling metal layers with different magnitudes of current to each portion 60, 62 of cap 22.

Figure 5:
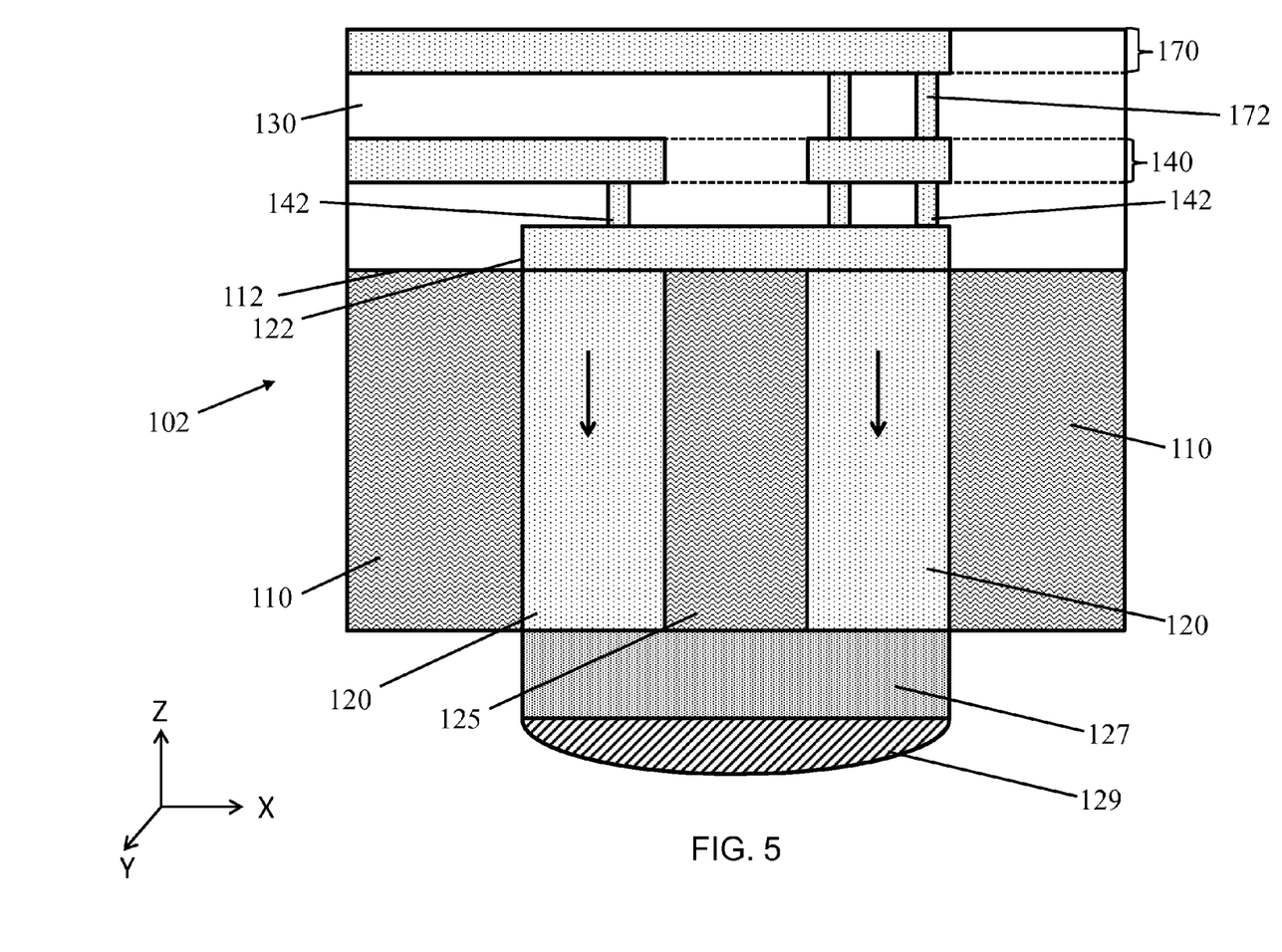
FIG. 5 shows a cross sectional view in plane X-Z of an IC structure, including two metal layers, according to an embodiment of the present disclosure.

Turning to FIG. 5, an embodiment of another IC structure 102 is shown. IC structure 102 can include a substrate 110. Substrate 110 of IC structure 102 can be a wafer in a larger semiconductor structure, and include a first surface 112. A TSV 120 may be embedded within substrate 110. TSV 120 may include a cap 122. A dielectric layer 130 may be adjacent to substrate 110. At least one first via 142 may be embedded within dielectric layer 130. One or more first vias 142 may electrically couple a first metal layer 140 to cap 122 of TSV 120 at respective contact points.

First metal layer 140 (denoted by corresponding phantom lines) may be adjacent to dielectric layer 130 and/or each first via 142. First metal layer 140 can contact at least one of (or each) first via 142. As a result, first vias 142 may electrically connect first metal layer 140 to TSV 120. In some embodiments, only one first via 142 may be electrically coupled to first metal layer 140.

IC structure 102 can include a silicon pillar 125 embedded within TSV 120. Silicon pillar 125 may be electrically insulative, thereby increasing the distribution of electric current within TSV 120 because electric current can pass through electrically conductive areas of TSV 120 outside silicon pillar 125. TSV 120 can have a contact 127 coupled to a surface opposite cap 122. Contact 127 can be used to electrically couple TSV 120 to an IC component 129, or provide another desired electrical connection.

In an embodiment, IC structure 102 can be coupled to a second metal layer 170. At least one second via 172 may couple first metal layer 140 or cap 122 of TSV 120 to second metal layer 170. Second metal layer 170 can be distinct from first metal layer 140, for example, by being located in a different plane of IC structure 2 or being separated from first metal layer 140 by dielectric layer 130 as shown in FIG. 5.

Current crowding in TSV 120 may be reduced as a result of electrical current being supplied to TSV 120 from both first metal layer 140 and second metal layer 170 at different points of cap 122, to create a substantially uniform current density throughout TSV 20. For example, in embodiments where silicon pillar 125 is embedded within TSV 120, first metal layer 140 can provide electrical current to a portion of TSV 120 outside silicon pillar 125. Second metal layer 170 can provide another electrical current, approximately equal to the current from first metal layer 140, to a remaining portion of TSV 120 also outside silicon pillar 125. In this manner, the electrical current supplied to TSV 120 is evenly distributed throughout TSV 120 and/or cap 122.

IC structure 102 can be further modified to reduce the risk of current crowding. In an embodiment, first and/or second vias 142, 172 can include a plurality of vias. Using a plurality of first and/or second vias 142, 172 can reduce current crowding by directing electrical current to various portions of cap 122 in a manner similar to that shown in IC structure 2 of FIGS. 3 and 4. In some embodiments, each via in the first or second plurality of vias 142, 172 can each have electrical resistances that are approximately equal to each other.

Figure 6:
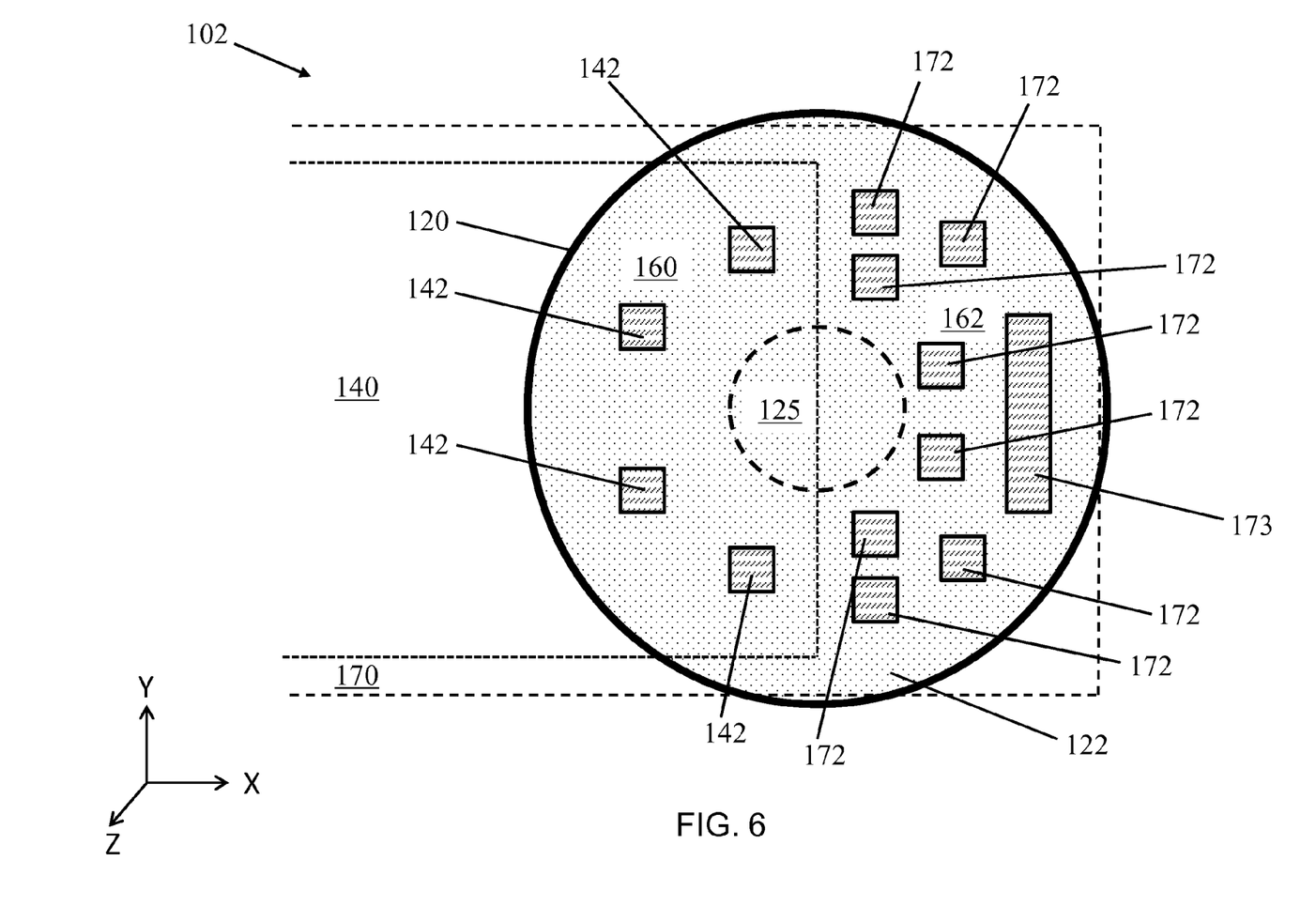
FIG. 6 shows a cross sectional view in plane X-Y of an alternative IC structure according to an embodiment of the present disclosure.

In another embodiment shown in FIG. 6, IC structure 102 can include a plurality of first vias 142 and/or a plurality of second vias 172. Each first via 142 can be coupled to cap 122 of TSV 120 at a first portion 160. Each second via 172 can be coupled to cap 122 at a second portion 162. Similar to an embodiment of IC structure 2 (FIG. 4), more second vias 172 can be coupled to second portion 162 than first vias 142 coupled to first portion 160. In addition, a via bar 173 of relatively less resistance than second vias 172 may couple second portion 162 to second metal layer 170, similar to via 32B shown in FIGS. 3 and 4. This arrangement can evenly distribute current from first metal layer 140 (shown in phantom) and second metal layer 170 (shown in phantom) throughout cap 122 to reduce current crowding in TSV 120. Specifically, electrical coupling between second portion 162 and second metal layer 170 can be less resistive than the respective electrical coupling between first portion 160 and first metal layer 140 if more current necessary in second portion 162 to evenly distribute the current density of TSV 120. In some embodiments, each portion 160, 162 can cover approximately half of a cross-section of cap 122.

Figure 7:
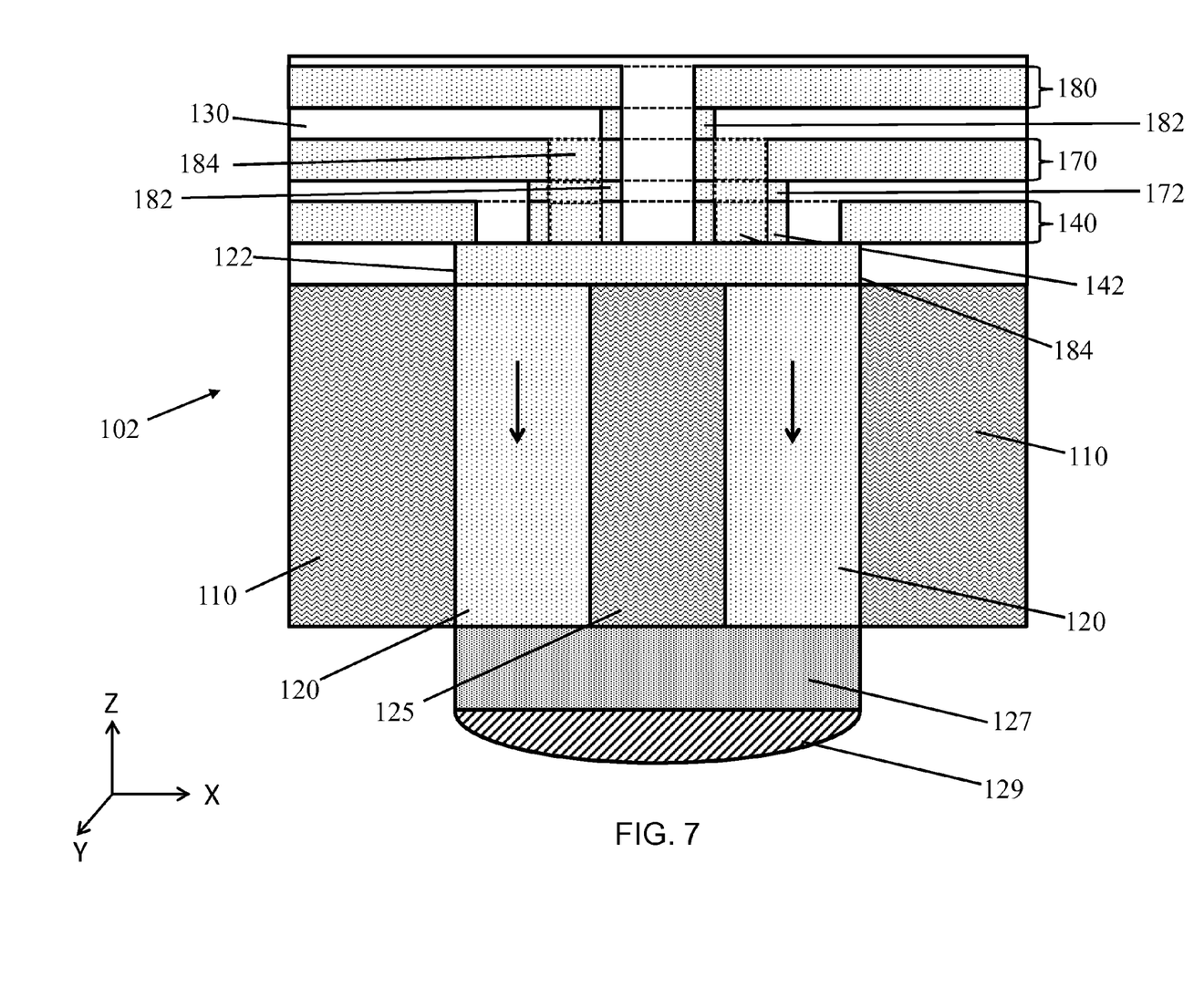
FIG. 7 shows a cross sectional view in plane X-Z of an IC structure, including three metal layers, according to an embodiment of the present disclosure.

Turning to FIG. 7, another embodiment of IC structure 102 is shown. Similar to embodiments discussed elsewhere herein, TSV 120 can be coupled to first and second metal layers 140, 170 through first and second vias 142, 172. In addition, cap 122, TSV 120, first metal layer 140, and/or second metal layer 170 can also be coupled to a third metal layer 180 through a third via 182. Third metal layer 180 may be distinct from first and second metal layers 140, 170 by being located in a different layer of IC structure 102, and/or being separated from other components (e.g., TSV 120, first and second metal layers 140, 170) by dielectric layer 130.

As shown by example in FIG. 7, third via 182 can, optionally, be a plurality of third vias 182. Each third via 182 can also extend through dielectric layer 130 and/or several metal layers (e.g., first and second metal layers 140, 170). In some embodiments, one or more metal wires 184 (shown in phantom) can electrically join two or more vias, shown by example in FIG. 7 as joining first via 142 with second via 172. Thus, embodiments of the present disclosure may evenly distribute current from each metal layer 140, 170, 180 across cap 122 of TSV 120. Furthermore, embodiments of the present disclosure are not limited to a maximum of three metal layers. Other embodiments in which TSV 120 is coupled to several other metal layers (e.g., five, ten, fifteen metal layers, etc.) are also contemplated. By electrically coupling third metal layer 180 to TSV 120, the uniformity of current density throughout cap 122 can be improved.

Figure 8:
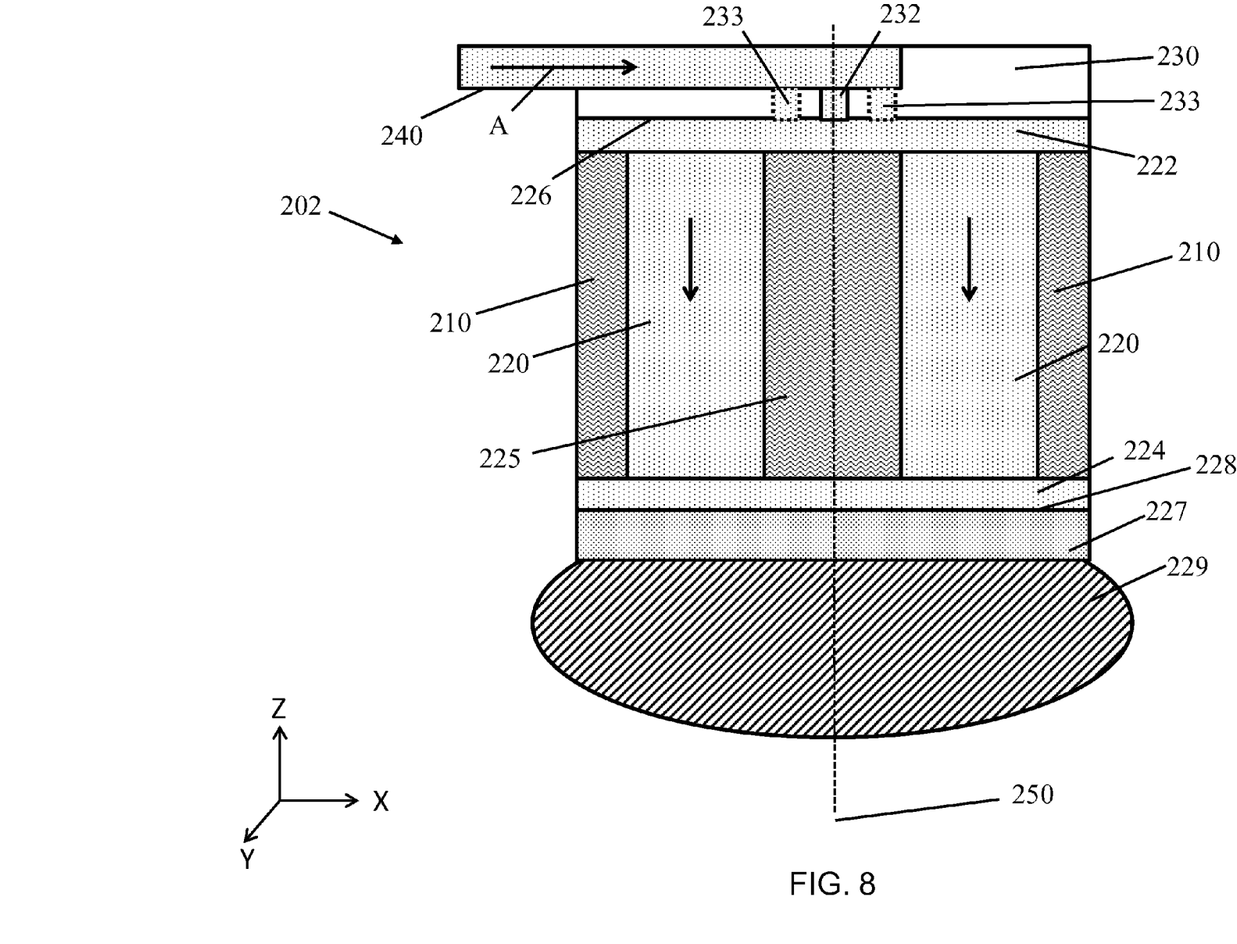
FIG. 8 shows a cross sectional view in plane X-Z of an additional IC structure according to an embodiment of the present disclosure.

Turning to FIG. 8, an embodiment of another IC structure 202 is shown. IC structure 202 can include a substrate 210. Similar to other embodiments, substrate 210 of IC structure 202 can be a wafer in a larger semiconductor structure. A TSV 220 may be embedded within substrate 210. TSV 220 can electrically couple a first cap 222 with a second cap 224. First cap 222 and second cap 224 can also be embedded in substrate 210. First cap 222 can include a first surface 226 coplanar with an edge of substrate 210. Second cap 224 can, similarly, include a second surface 228 coplanar with another edge of substrate 210. Each cap 222, 224 may be composed of an electrically conductive material (e.g., copper, silicon, tungsten, silver, or another electrically conductive metal), and in some embodiments may be composed of the same material as TSV 220. Caps 222, 224 can radially distribute or consolidate electric current leaving and entering TSV 220 by being coupled to metal wires and/or vias at or near their center, as discussed elsewhere herein. The thickness and/or resistance of each cap 222, 224 can be adjusted as desired to further increase the uniformity of current density entering TSV 220. In this manner, each cap 222, 224 can prevent electric current from being most concentrated at an interface between substrate 210 and TSV 220, where electromigration is otherwise likely to occur.

A dielectric layer 230 may be adjacent to substrate 210. As described elsewhere herein, dielectric layer 230 can stop current from crossing between electrically conductive components of IC structure 202 with no electrical connections therebetween. At least one via 232 may be embedded within dielectric layer 230 to provide a vertical electrical connection from other structures to TSV 220 and/or first cap 222. One or more vias 232 may be coupled to first cap 222 of TSV 220 at respective contact points. As discussed elsewhere herein with respect to vias 32, 32B (FIGS. 1-4), vias 232 can be electrically conductive metals through which electric current may flow. A metal wire 240 may be adjacent to and/or coupled to one or more vias 232. Electric current in metal wire 240 can be communicated to TSV 220 through vias 232. As a result, vias 232 may provide a vertical electrical connection between metal wire 240 and first cap 222 of TSV 220. In some embodiments, only one via 232, preferably of large size, may be electrically coupled to metal wire 240.

IC structure 202 can include a silicon pillar 225 embedded within TSV 220. Silicon pillar 225 may be electrically insulative, thereby increasing the distribution of electric current within TSV 220 because electric current can pass through electrically conductive areas of TSV 220 outside silicon pillar 225. TSV 220 can have a contact 227 coupled to second surface 228 of second cap 224. Contact 227 can thus electrically connect TSV 220 to other structures capable of receiving electric current. As an example, contact 227 may be coupled to substrate 210 as part of a metal structure formed by "under bump metallization" (UBM). Contact 227 can electrically couple TSV 220 to an IC component 229.

TSV 220 can define a center axis 250 along its core. In an embodiment, a centroid (e.g., a center of mass, a length midpoint, etc.) of via 232 is substantially aligned with center axis 250. Additionally, first and second caps 222, 224 can be substantially aligned with center axis 250. As used herein, the term "substantial alignment" or "substantially aligned" may refer to any alignment through which two elements share a common axis. In some circumstances, "substantial alignment" may include an alignment between two elements that is physically and/or operationally indistinguishable from each element sharing a common axis. Through this arrangement, electrical current may enter TSV 220 from via 232 and caps 222, 224 substantially along center axis 250.

In some embodiments, silicon pillar 225 may also be located along center axis 250 of TSV 220, thereby causing electrical current entering TSV 220 from via 232 to distribute radially and uniformly throughout first cap 222. In addition, via 232 may be substantially aligned with silicon pillar 225 if desired. To further reduce current crowding, a centroid of via 232 can be substantially aligned with both the center of silicon pillar 225 and center axis 250. As a result the risk of current crowding and electromigration within localized regions of TSV 220 may be reduced because current enters TSV 220 along center axis 250 and disperses throughout first cap 222 before entering TSV 220.

In an embodiment of IC structure 202, as depicted in FIG. 8, a plurality of vias 233 (shown in phantom) can also electrically couple metal wire 240 with first cap 222. Each via 233 in the plurality may increase current distribution by being located in close proximity to via 232. Specifically, plurality of vias 233 can be in the form of a cluster about center axis 250 and the center of cap 222. As a result, current entering cap 222 from via 232 plurality of vias 233 continues to be oriented along or in close proximity to center axis 250. In embodiments where silicon pillar 225 is present, each of the plurality of vias 233 may land in a region substantially aligned with silicon pillar 225. Here, current will also distribute radially throughout first cap 222 before entering TSV 220 to avoid the electrically insulative silicon pillar 225 as a result of via 232 and plurality of vias 233 being located above silicon pillar 225.

In alternative embodiment, silicon pillar 225 may not be oriented along center axis 250. In this circumstance, IC structure 202 can be modified such that the centroid of via 232 and/or each of the plurality of vias 232 is substantially aligned with the radial center of silicon pillar 225. The presence of silicon pillar 225 may cause TSV 220 to include an electrically conductive portion that is substantially annular and concentric with a substantially circular cross-section of silicon pillar 225.

The terminology used herein is for the purpose of describing particular embodiments only and is not intended to be limiting of the disclosure. As used herein, the singular forms "a," "an" and "the" are intended to include the plural forms as well, unless the context clearly indicates otherwise. It will be further understood that the terms "comprises" and/or "comprising," when used in this specification, specify the presence of stated features, integers, steps, operations, elements, and/or components, but do not preclude the presence or addition of one or more other features, integers, steps, operations, elements, components, and/or groups thereof.

This written description uses examples to disclose the invention, including the best mode, and to enable any person skilled in the art to practice the invention, including making and using any devices or systems and performing any incorporated methods. The patentable scope of the invention is defined by the claims, and may include other examples that occur to those skilled in the art. Such other examples are intended to be within the scope of the claims if they have structural elements that do not differ from the literal language of the claims, or if they include equivalent structural elements with insubstantial differences from the literal language of the claims.

What is claimed is:

1. An integrated circuit (IC) structure comprising:
    a through-semiconductor via (TSV) embedded in a substrate;
    a dielectric layer adjacent to the substrate;
    a metal layer adjacent to the dielectric layer;
    a plurality of vias each embedded within the dielectric layer and coupling the metal layer to the TSV at respective contact points, wherein the plurality of vias includes a first via and a second via therein, the first via having one of a different material composition or a different cross-sectional area relative to the second via, and wherein the plurality of vias is configured to create a substantially uniform current density throughout the TSV.

2. The IC structure of claim 1, wherein an elbow junction between the metal layer and the plurality of vias includes a feed region, and wherein each of the plurality of vias creates a substantially uniform electrical resistance between the feed region of the metal layer and the TSV.

3. The IC structure of claim 1, further comprising a cap interposed between the TSV and the plurality of vias.

4. The IC structure of claim 1, wherein the TSV includes a first portion and a second portion each coupled to at least one of the plurality of vias, and more of the plurality of vias are coupled to the cap of the TSV at the second portion than at the first portion.

5. The IC structure of claim 1, wherein a cross-sectional area of the first via is greater than a cross-sectional area of the second via.

6. The IC structure of claim 1, wherein the first via of the plurality of vias includes a different material composition from the second via of the plurality of vias.

7. The IC structure of claim 1, wherein the TSV includes a silicon pillar therein, the TSV is substantially cylindrical, and wherein the silicon pillar is located along an axis substantially parallel to a center axis of the TSV.

8. The IC structure of claim 1, further comprising a capture pad interposed between the TSV and one of the plurality of vias.

9. The IC structure of claim 1, wherein the capture pad comprises one of a transition metal and a refractory metal.

10. An integrated circuit (IC) structure comprising:
    a through-semiconductor via (TSV) embedded in a substrate;
    a dielectric layer adjacent to the substrate;
    a first via embedded in the dielectric layer and coupling the TSV to a first metal layer; and
    a second via embedded in the dielectric layer and coupling the TSV to a second metal layer and having one of a different material composition or a different cross-sectional area relative to the first via, the second metal layer being distinct and vertically separated from the first metal layer, wherein a current within the first metal layer is different from a current within the second metal layer, and wherein the first via and the second via are configured to create a substantially uniform current density throughout the TSV.

11. The IC structure of claim 10, wherein the second via comprises a plurality of second vias, and each one of the plurality of second vias has approximately the same electrical resistance.

12. The IC structure of claim 10, further comprising a cap interposed between the TSV and the first and second vias.

13. The IC structure of claim 10, wherein the first via comprises a plurality of first vias, and each one of the plurality of first vias has approximately the same electrical resistance.

14. The IC structure of claim 13, wherein the TSV includes a first portion and a second portion, and more of the plurality of first vias are coupled to the second portion than to the first portion.

15. The IC structure of claim 10, further comprising a third via embedded in the dielectric layer and coupling the TSV to a third metal layer, the third metal layer being vertically separated and distinct from the first metal layer and the second metal layer, wherein the first via, the second via, and the third via are configured to create a substantially uniform current density throughout the TSV, and wherein a current within the third metal layer is different from the current within the first metal layer and the current within the second metal layer.

16. An integrated circuit (IC) structure comprising:
a through-semiconductor via (TSV) having a center axis and an end;
a cap contacting the end of the TSV and substantially aligned with the center axis of the TSV;
a dielectric layer adjacent to the TSV;
a metal wire adjacent to the dielectric layer;
a first via embedded in the dielectric layer and electrically coupling the metal wire to the cap, wherein a centroid of the first via is substantially aligned with the center axis of the TSV; and
a plurality of second vias embedded within the dielectric layer and coupling the metal layer to the TSV at respective contact points, wherein the first via and the plurality of second vias are configured to create a substantially uniform current density throughout the TSV, and wherein the first via includes one of a different material composition or a different cross-sectional area relative to the plurality of second vias.

17. The IC structure of claim 16, wherein the plurality of second vias is substantially aligned with a cross sectional region of the end of the TSV concentric with the center axis.

18. The IC structure of claim 16, wherein the TSV includes a silicon pillar therein, and the centroid of the first via is substantially aligned with the silicon pillar.

19. The IC structure of claim 18, wherein the first via comprises one of a plurality of first vias each substantially aligned with the silicon pillar.

20. The IC structure of claim 18, wherein the TSV has an annular cross-sectional area, and the silicon pillar has a circular cross-sectional area concentric with the annular cross-sectional area of the TSV.

* * * * *